United States Patent
Aegerter et al.

(10) Patent No.: US 6,413,436 B1
(45) Date of Patent: Jul. 2, 2002

(54) SELECTIVE TREATMENT OF THE SURFACE OF A MICROELECTRONIC WORKPIECE

(75) Inventors: Brian Aegerter; Curt T. Dundas; Michael Jolley; Tom L. Ritzdorf; Steven L. Peace; Gary L. Curtis; Raymon F. Thompson, all of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/437,926

(22) Filed: Nov. 10, 1999

Related U.S. Application Data

(63) Continuation of application No. PCT/US99/05674, filed on Mar. 15, 1999.
(60) Provisional application No. 60/117,474, filed on Jan. 27, 1999.

(51) Int. Cl.⁷ .................................................. C23F 1/02
(52) U.S. Cl. .............................. 216/13; 216/92; 216/95; 216/105; 134/33; 134/36; 438/748; 438/754; 438/928; 438/963
(58) Field of Search ................... 216/13, 41, 92, 216/95, 105; 134/33, 36; 438/748, 754, 928, 963

(56) References Cited

U.S. PATENT DOCUMENTS

| | | | |
|---|---|---|---|
| 3,727,620 A | 4/1973 | Orr | 134/95 |
| 3,953,265 A | 4/1976 | Hood | 156/8 |
| 4,132,567 A | 1/1979 | Blackwood | 134/1 |
| 4,439,243 A | 3/1984 | Titus | 134/33 |
| 4,439,244 A | 3/1984 | Allevato | 134/33 |
| 4,544,446 A | 10/1985 | Cady | 156/639 |
| 4,664,133 A | 5/1987 | Silvernail et al. | 134/99 |
| 4,750,505 A | 6/1988 | Inuta et al. | 134/153 |
| 4,790,262 A | 12/1988 | Nakayama et al. | 118/52 |
| 4,838,289 A | 6/1989 | Kottman et al. | 134/153 |
| 4,903,717 A | 2/1990 | Sumnitsch | 134/99 |
| 4,982,215 A | 1/1991 | Matsuoka | 354/299 |
| 4,982,753 A | 1/1991 | Grebinski, Jr. et al. | 134/95 |
| 5,020,200 A | 6/1991 | Mimasaka | 29/25.01 |
| 5,032,217 A | 7/1991 | Tanaka | 156/640 |
| 5,117,769 A | 6/1992 | DeBoer | 118/666 |
| 5,168,886 A | 12/1992 | Thompson et al. | 134/153 |

(List continued on next page.)

FOREIGN PATENT DOCUMENTS

| | | | |
|---|---|---|---|
| JP | 59-208831 | 11/1984 | |
| JP | 60-137016 | 7/1985 | |
| JP | 61-196534 | of 1986 | |
| JP | 62-166515 | 7/1987 | |
| JP | 63-185029 | 7/1988 | |
| JP | 1-120023 | 5/1989 | |
| JP | 4-94537 | 3/1992 | H01L/21/304 |
| JP | 5-13322 | 1/1993 | |
| JP | 5-21332 | 1/1993 | |
| JP | 5-326483 | 12/1993 | |
| JP | 6-45302 | 2/1994 | |
| JP | 52-12576 | 1/1997 | |

Primary Examiner—Randy Gulakowski
Assistant Examiner—Allan Olsen
(74) Attorney, Agent, or Firm—Lyon & Lyon LLP

(57) ABSTRACT

In a process for treating a workpiece such as a semiconductor wafer, a processing fluid is selectively applied or excluded from an outer peripheral margin of at least one of the front or back sides of the workpiece. Exclusion and/or application of the processing fluid occurs by applying one or more processing fluids to the workpiece while the workpiece and a reactor holding the workpiece are spinning. The flow rate of the processing fluids, fluid pressure, and/or spin rate are used to control the extent to which the processing fluid is selectively applied or excluded from the outer peripheral margin.

17 Claims, 3 Drawing Sheets

U.S. PATENT DOCUMENTS

| | | | |
|---|---|---|---|
| 5,209,180 A | 5/1993 | Shoda et al. .................. 118/52 |
| 5,222,310 A | 6/1993 | Thompson et al. ............ 34/202 |
| 5,224,503 A | 7/1993 | Thompson et al. ......... 134/95.2 |
| 5,224,504 A | 7/1993 | Thompson et al. ......... 134/95.2 |
| 5,349,978 A | 9/1994 | Sago et al. .................. 134/153 |
| 5,361,449 A | 11/1994 | Akimoto ....................... 15/302 |
| 5,421,893 A | 6/1995 | Perlov ......................... 118/725 |
| 5,431,421 A | 7/1995 | Thompson et al. .......... 279/139 |
| 5,445,172 A | 8/1995 | Thompson et al. .......... 134/153 |
| 5,513,594 A | 5/1996 | McClanahan et al. ....... 118/503 |
| 5,551,986 A | 9/1996 | Jain .............................. 134/6 |
| 5,591,262 A | 1/1997 | Sago et al. .................... 118/52 |
| 5,616,069 A | 4/1997 | Walker et al. ................. 451/56 |
| 5,666,985 A | 9/1997 | Smith, Jr. et al. ............ 134/142 |
| 5,677,824 A | 10/1997 | Harashima et al. ......... 361/234 |
| 5,678,116 A | 10/1997 | Sugimoto et al. ........... 396/611 |
| 5,718,763 A | 2/1998 | Tateyama et al. .............. 118/52 |
| 5,762,708 A | 6/1998 | Motoda et al. ................ 118/52 |
| 5,762,751 A | 6/1998 | Bleck et al. .................. 156/345 |
| 5,779,796 A | 7/1998 | Tomoeda et al. ............ 118/319 |
| 5,815,762 A | 9/1998 | Sakai et al. .................. 396/611 |
| 5,845,662 A | 12/1998 | Sumnitsch .................. 134/153 |
| 5,860,640 A | 1/1999 | Marohl et al. .......... 269/289 R |
| 5,868,866 A | 2/1999 | Maekawa et al. .............. 134/34 |
| 5,882,433 A | 3/1999 | Ueno .......................... 134/31 |
| 5,885,755 A | 3/1999 | Nakagawa et al. ......... 430/325 |
| 5,916,366 A | 6/1999 | Ueyama et al. ................ 118/52 |
| 5,942,035 A | 8/1999 | Hasebe et al. ................. 118/52 |
| 5,997,653 A | 12/1999 | Yamasaka ..................... 134/2 |
| 6,268,289 B1 * | 7/2001 | Chowdhury et al. ........ 438/644 |
| 6,309,981 B1 * | 10/2001 | Mayer et al. ................ 156/345 |
| 2001/0041447 A1 * | 11/2001 | Nogami ..................... 438/706 |

\* cited by examiner

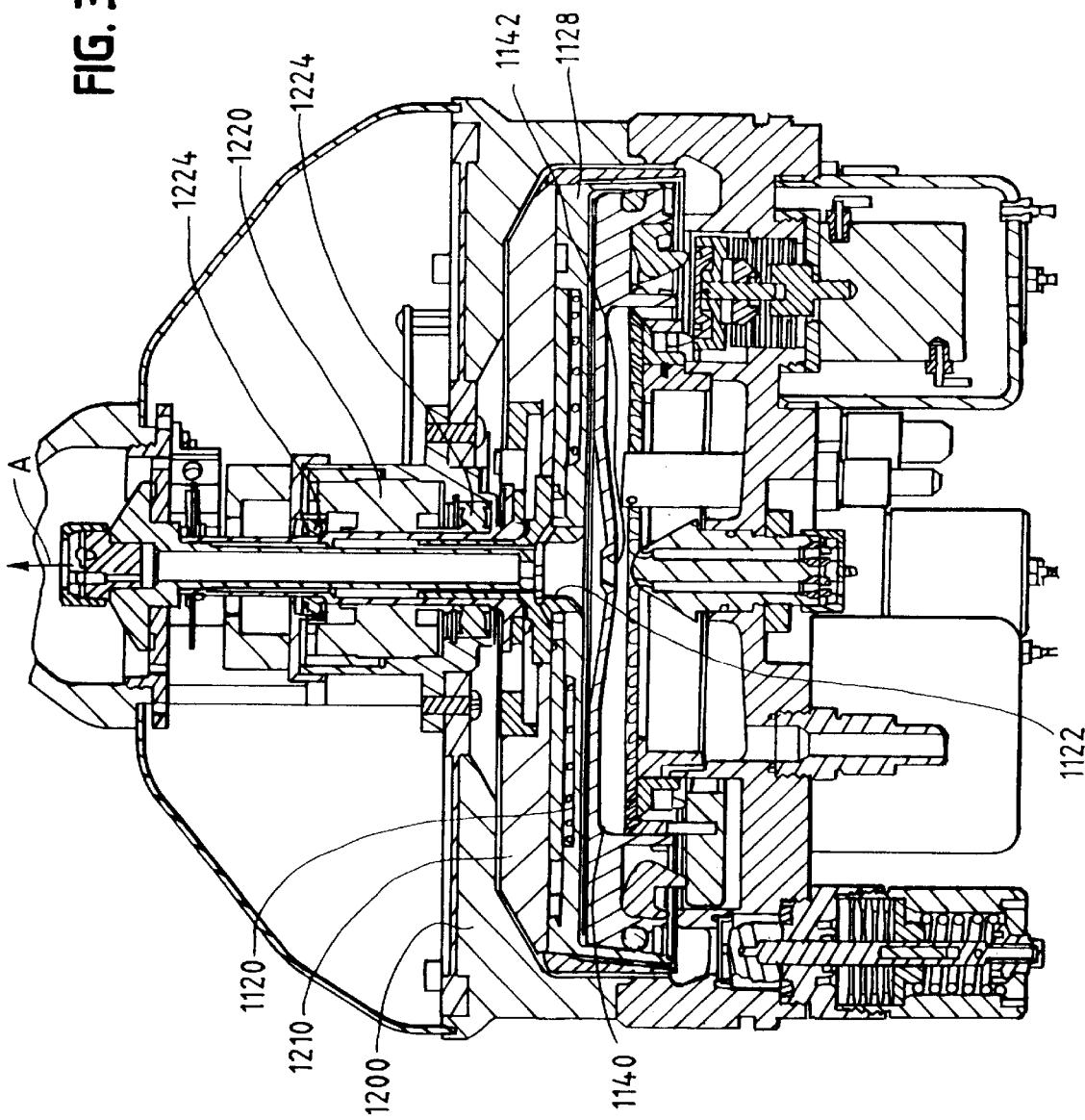

SELECTIVE TREATMENT OF THE SURFACE OF A MICROELECTRONIC WORKPIECE

This application is a continuation of: International Application No. PCT/US99/05674, filed Mar. 15, 1999 and now pending, and 60/117,474, filed Jan. 27, 1999, and now pending. The disclosures of those a applications, as well as that of U.S. patent application Ser. No. 09/437,711, filed on the same day as this application, are incorporated herein by reference.

BACKGROUND OF THE INVENTION

This invention pertains to treating a silicon wafer to remove a thin film, such as a copper film, from regions on the silicon wafer.

The fabrication of a microelectronic circuit and/or component from a substrate typically involves a substantial number of processes. Many of these processes involve the deposition of a thin film on the surface of the workpiece followed by contact with a processing liquid, vapor, or gas. In a known process for treating a microelectronic workpiece, such as a silicon wafer, on which microelectronic devices have been fabricated and which has a front, device side, a back, non-device side, and an outer perimeter, thin-film layers are successively applied and etched to form, for example, a metallized interconnect structure. In a typical metallization process, a barrier layer is applied over a dielectric layer to the front side of the workpiece. Depending upon the particular process used to form the interconnect structures, the dielectric layer may include a pattern of recessed micro-structures that define the various interconnect paths. A thin metal film, such as a copper film, is applied exterior to the barrier layer. In most instances, the thin film serves as an initial seed layer for subsequent electroplating of a further metal layer, such as a further copper layer. Due to manufacturing constraints, the thin film is not applied over an outer, peripheral margin of the front side.

Known techniques, such as physical vapor deposition (sputtering) or chemical vapor deposition, are typically used to apply the barrier layer and the thin film. In instances in which a further metal layer is to be electroplated exterior to the thin film, one or more electrical contacts are connected to an outer margin of the thin film to provide plating power.

The surface area of the front side beyond the inner boundary of the outer margin of the thin film is not available for fabricating the microelectronic devices since the present manufacturing processes limit the extent to which device structures can be formed at the outer margin. It would be highly desirable and would result in increased yield if more of the surface area beyond the present limits of the outer margin of the thin film were available for fabricating interconnect structures.

In the known process discussed above, and in other processes, contamination by copper, other metals, or other contaminants can occur on the back side of the workpiece. Although copper and other metals tend to diffuse rapidly through silicon or silicon dioxide, the back side is generally not provided with barrier layers that are capable of preventing copper, other metals, or other contaminants from diffusing through the silicon wafer to the front side, at which such contamination can be very detrimental to device performance.

Such contamination can result from overspraying or other processing artifacts or from cross-contamination via fabrication tools. Such contamination can occur on the outer perimeter of a silicon wafer as well as on its back side. If not removed, such contamination can lead to cross-contamination of other wafers, via fabrication tools. Such contamination can be very difficult to remove, particularly if the contaminant has formed a stable silicide. It would be highly desirable if such contamination could be easily removed in a controlled manner without detrimentally affecting the front side of the workpiece.

SUMMARY OF THE INVENTION

In a first aspect of the invention, a processing fluid is selectively applied or excluded from an outer peripheral margin of at least one of the front or back sides of the workpiece. Exclusion and/or application of the processing fluid occurs by applying one or more processing fluids to the workpiece as the workpiece, and a reactor holding the workpiece, are spinning. The flow rate of the one or more processing fluids, fluid pressure, and/or spin rate are used to control the extent to which the processing fluid is selectively applied or excluded from the outer peripheral margin.

In a second aspect of the invention, a thin film is applied over the front side and over at least a portion of the outer perimeter. A barrier layer may be applied over the front side and over at least a portion of the outer perimeter, whereupon a further thin film, such as a conductive seed layer, is applied over the barrier layer.

After one or more further intervening steps, such as electroplating of a metal layer onto the conductive seed layer, an etchant capable of removing one or more of the thin film layers is caused to flow over an outer margin of the front side while the etchant is prevented from flowing over the front side except for the outer margin. Thus, the etchant only contacts the outer margin of the front side thereby selectively removing only the one or more thin film layers from the outer margin of the front side. If the etchant is also caused to flow over the back side and over the outer perimeter, as well as over the outer margin of the front side, the one or more thin film layers are removed from the outer perimeter and any contaminant that the etchant is capable of removing is stripped from the back side as well. A cleaning chemical can be used instead of an etchant in some applications to remove or dissolve the one or more thin film layers as described above.

These and other objects, features, and advantages of this invention are evident from the following description of a preferred mode for carrying out this invention, with reference to the accompanying drawings.

BRIEF DESCRIPTION OF THE DRAWINGS

FIGS. 3 and 4 illustrate one embodiment of a reactor that can be used to implement the process of the present invention.

DETAILED DESCRIPTION OF ONE EMBODIMENT OF THE INVENTION

Figure 1A:
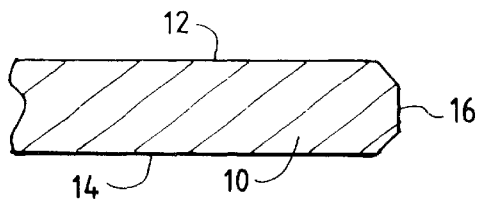
FIGS. 1A, 1B, 1C, and 1D are fragmentary, cross-sectional views of a microelectronic workpiece, such as a silicon wafer, at various stages of a known sequence of processing steps in accordance with prior art.
Figure 2A:
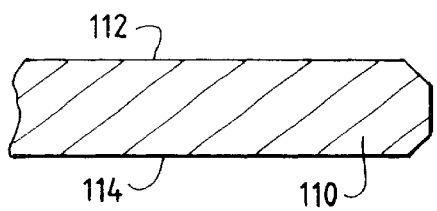
FIGS. 2A, 2B, 2C, and 2D are fragmentary, cross-sectional views of a microelectronic workpiece, such as a silicon wafer, at various stages of a novel sequence of processing steps in accordance with this invention.
Figure 1B:
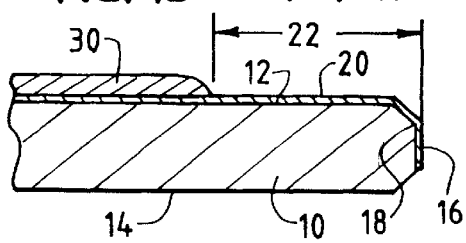

Although the process of the present invention has applicability to any process in which a processing fluid is selectively provided to or excluded from an outer margin of a workpiece, the invention will be described in connection with a sequence of processing steps for depositing on or more metallization layers or metallized structures on the workpiece. The known sequence of processing steps in accordance with the prior art begins with a silicon wafer 10, on which microelectronic devices (not shown) have been fabricated. As illustrated in FIG. 1A, the wafer 10 has a front, device side 12, a back, non-device side 14, and a beveled, outer perimeter 16. Via physical vapor deposition (sputtering) or chemical vapor deposition, a barrier layer 20 is applied over the front side 12 and over an upper portion 18 of the outer perimeter 16. A thin-film seed layer, such as a copper film 30, is applied over the barrier layer 20. Conventionally, the seed layer 30 is only deposited within the bounds of an outer margin 22 of the barrier layer 20, as illustrated in FIG. 1B. At an outer edge 32 of the seed layer, or copper film 30, one or more electrical contacts 40 to be used in providing electroplating power to the seed layer are placed in electrical contact with the copper film 30, as illustrated in FIG. 1C.

Figure 1C:
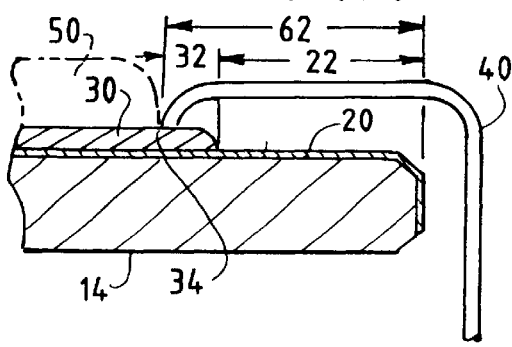

After the one or more electrical contacts 40 have been connected to the seed layer copper film 30 a further copper layer 50 from which interconnect structures and/or metallized devices are fabricated is electroplated onto the wafer 10 as illustrated in FIG. 1C. The electrical contact(s) 40 are then removed to provide the resultant multi-film structure, shown generally at 60 in FIG. 1D. Beyond an inner boundary 34 of the outer margin 32 of the copper layer 50, an annular region 62 of the front side 12 is not available for fabricating such interconnect structures or metallized devices.

Figure 2B:
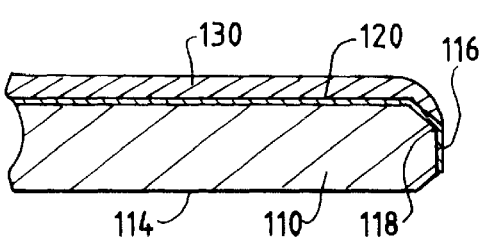
Figure 2C:
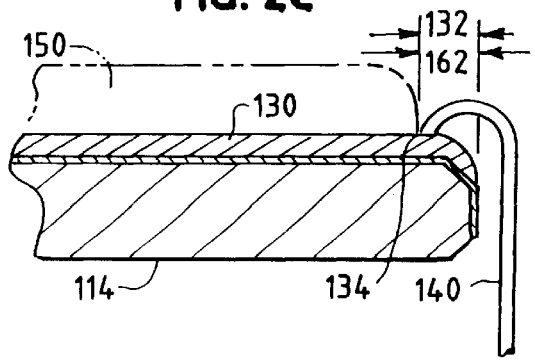

The processing steps of the invention, as shown in FIGS. 2A–2D, begin with a silicon wafer 110, which is similar to the silicon wafer 10 before processing, on which microelectronic devices (not shown) have been fabricated, and which has a front, device side 112, a back, non-device side 114, and a beveled, outer perimeter 116. Via physical vapor deposition (sputtering) or chemical vapor deposition, a barrier layer 120 is applied over the front side 112 an,d over an upper portion 118 of the outer perimeter 116 and a thin seed layer, such as a copper film 130 is applied over the entire barrier layer 120, without exclusion from a peripheral outer margin, so as to cover the barrier layer 120 where applied over the front side 112 and over the upper portion 118 of the outer perimeter 116, as illustrated in FIG. 2B. At an outer edge 132 of the copper seed layer 130, one or more electrical contacts 140 to be used in electroplating are connected to provide electroplating power to the copper film 130, as illustrated in FIG. 2C. As illustrated, the outer edge 132 at which contact may be made for the supply of electroplating power illustrated in FIG. 2C is substantially closer to the peripheral edge than the process as illustrated in FIG. 1C.

A further copper film 150 from which metallized interconnects and/or microelectronic devices are fabricated is then applied using an electrochemical deposition process. As illustrated in FIG. 2C, the further copper film 150 is deposited inside of the outer margin 132 of the copper film 130, up to the boundary designated by 134. The electrical contact 140 is then removed leaving the resultant multi-layer structure shown generally at 160 of FIG. 2D. Metallized devices (not shown) and/or interconnects are formed by known techniques, from the resultant structure 160. After the copper layer 150 has been deposited, the sewed layer 130, film 150, and/or barrier layer 120 may be removed from the outer margin 132 and, if desired peripheral edge 116 of the workpiece 110. Removal of at least layer 130 from the outer margin assists in preventing film flaking and cross-contamination problems that may occur during subsequent workpiece processing.

In accordance with the process, a liquid processing fluid is selectively applied to the outer peripheral margin of at least the front side of the workpiece. Exclusion and/or application of the processing fluid occurs by applying one or more processing fluids to the workpiece as the workpiece and corresponding reactor are spinning about an axis of rotation that is generally parallel (or antiparallel) to the vector defining the face of the workpiece being processed. The flow rate of the one or more processing fluids, fluid pressure, and/or spin rate are used to control the extent to which the processing fluid is selectively applied to the outer peripheral margin.

A reactor suitable for executing the foregoing removal process may generally be comprised of upper and lower members that define an upper chamber and a lower chamber with respect to the workpiece contained therein. A centrally disposed inlet is provided to each of the upper an lower chambers for supplying one or more processing fluids. Fluid outlets are disposed at peripheral portions of the chambers and are adapted to assist in the exclusion of one processing fluid from the outer margin of the workpiece while allowing intrusion of an etchant thereat. The upper and lower chambers are rotated conjointly so as to distribute a processing fluid in the upper chamber across an upper side of the workpiece through centripetal acceleration and so as to distribute a processing fluid in the lower chamber across a lower side of the workpiece through centripetal acceleration. Depending upon the processes being performed, however, the processing fluids in the upper and lower chambers may be the same fluid or different fluids.

Also rather than relying on the rotation of the workpiece, the processing fluid could also be selectively driven by pumps.

Through control of the respective pressures of the processing fluids entering the respective chambers and of the rotational speed of the rotating chambers, it is possible to control the reactor so as to cause the processing fluid entering the inlet of the lower chamber to flow over the near side of the wafer, over the outer perimeter of the workpiece, and over an outer margin of the far side of the workpiece, and so as to prevent the same processing fluid from flowing over the far side except for the outer margin. The control of the fluid pressures may be achieved for example through the use of a pump for liquids, or a pressure regulator for a pressurized gas source.

The process provided by this invention can be advantageously practiced in a reactor illustrated and described in PCT/US99/05676, U.S. Pat. No. 6,264,752 and Provisional U.S. patent application and 60/116,750, incorporated herein by reference.

Figure 4:
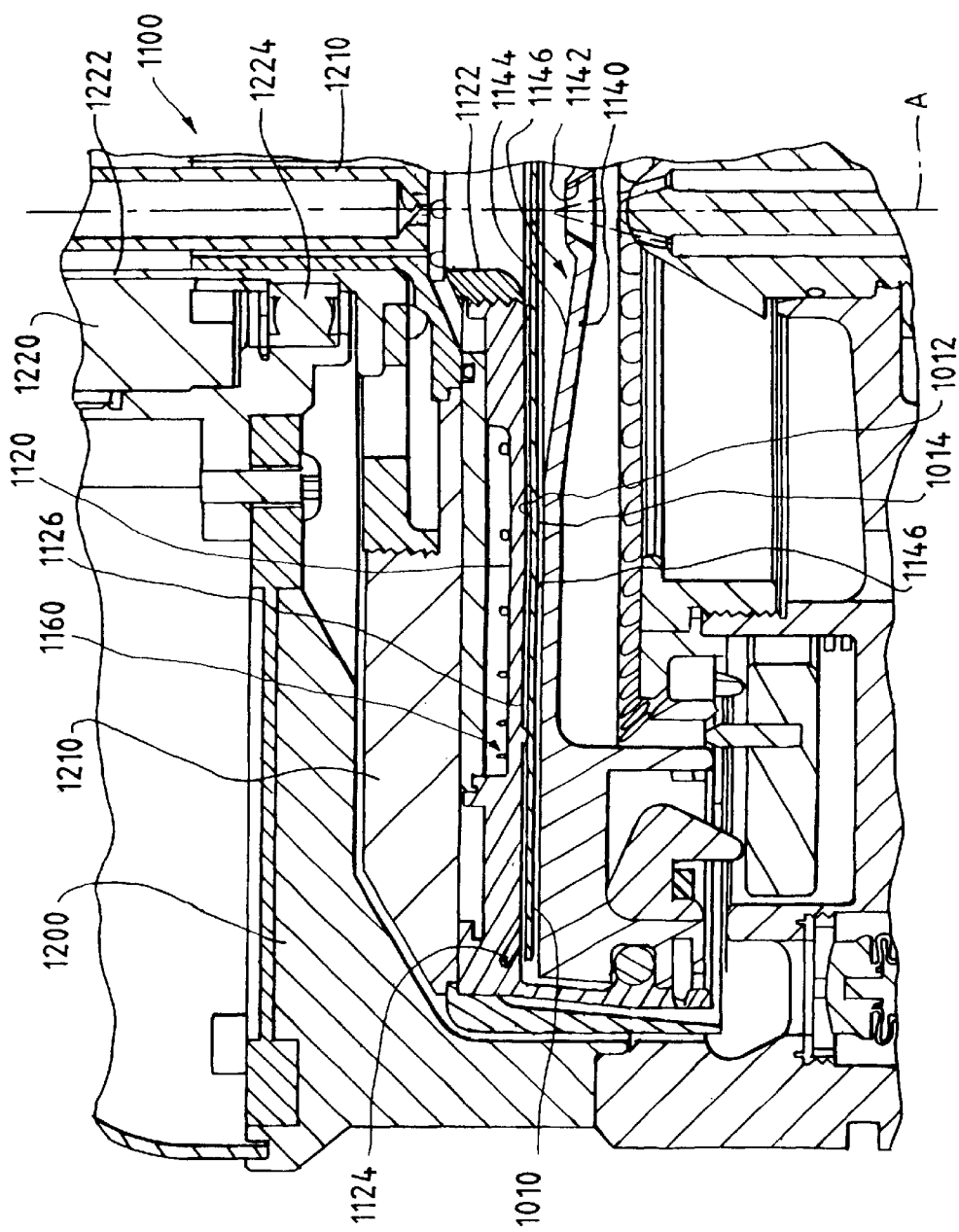

As shown in the FIGS. 3 and 4, a reactor 1100 for processing a microelectronic workpiece, such as a silicon wafer 1010 having an upper side 1012, a lower side 1014, and an outer, circular perimeter 1016, in a micro-environment constitutes a preferred platform for the practice of the process of this invention. For certain applications, the upper side 1012 is the front side, which may be otherwise called the device side, and the lower side 1014 is the back side, which may be otherwise called the non-device side. However, for other applications, the silicon wafer 1010 is inverted.

Generally, except as disclosed herein, the reactor 1100 is similar to the reactors illustrated and described in U.S. Pat.

No. 6,264,752. However, as illustrated in the drawings and described herein, the reactor 1100 is improved to be more versatile in executing select microelectronic fabrication processes.

The reactor 1100 has an upper chamber member or rotor that includes an upper chamber wall 1120 and a lower chamber member or rotor that includes a lower chamber wall 1140. These walls 1120, 1140, are arranged to open so as to permit a wafer 1010 to be loaded into the reactor 1100 for processing, by a loading and unloading mechanism (not shown) that, for example, may be in the form of a robot having an end effector. These walls 1120, 1140, are arranged to close so as to define a capsule 1160 supporting a wafer 1010 in a processing position, between these walls 1120, 1140.

The reactor 1010 has an head 1200 containing a rotor assembly 1210 supported by bearings 1124. A motor 1220 for rotating the rotor 1210, about a vertical axis A is supported in the head 1200.

The rotor assembler includes the upper rotor and a lower rotor which can be moved vertically apart, for loading and unloading, and which can be brought together, for processing a wafer. The upper rotor has an inlet 1122 in an upper chamber wall 1120 for entry of processing fluids, which may be liquid, vaporous, or gaseous. The lower rotor similarly has a lower chamber wall 1140 with an inlet 1142 for such fluids. A nozzle 1212 in the head 1200 extends axially through a sleeve 1222, so as not to interfere with the rotation of the sleeve 1222. The upper nozzle 1212 directs streams of processing fluids downwardly through the inlet 1122 of the upper chamber wall 1120.

The upper chamber wall 1120 includes an array of similar outlets 1124, which are spaced similarly at uniform angular spacings around the vertical axis A. In the disclosed embodiment, thirty-six such outlets 1124 are employed. The outlets 1124 are spaced radially apart on a circle, with each outlet at the same distance from axis A. The outlets are located near the outside circumference of the rotors, typically about 1.5 mm in from the edge of the rotors.

When the upper and lower chamber walls 1120, 1140, are closed, they define a micro-environment reactor 1160 having an upper processing chamber 1126 that is defined by the upper chamber wall 1120 and by a first generally planar surface of the supported wafer 1010, and a lower processing chamber 1146 that is defined by the lower chamber wall 1140 and a second generally planar surface of the supported wafer opposite the first side. The upper and lower processing chambers 1126, 1146, are in fluid communication with each other in an annular region 1130 beyond the outer perimeter 16 of the supported wafer 1010 and are sealed by an annular, compressible seal (e.g. O-ring) 1132 bounding a lower portion 1134 of the annular region 1130. The seal 1132 allows processing fluids entering the lower inlet 1142 to remain under sufficient pressure to flow toward the outlets 1134.

The reactor 1100 is particularly suitable for executing a range of unique microfabrication processes. For example, reactor 1100 is particularly suited to execute a process that requires complete contact of a processing fluid at a first side of a workpiece and at only a peripheral margin portion of the second side thereof. Such processes may be realized because processing fluids entering the inlet 1142 of the lower chamber wall 1140 can act on the lower side 1014 of a supported wafer 1010, on the outer periphery 1016 of the supported wafer 1010, and on an outer margin 1018 of the upper side 1012 of the supported wafer 10 before reaching the outlets 1124, and because processing fluids entering the inlet 1122 of the upper chamber wall 1120 can act on the upper side 1012 of the supported wafer 1010, except for the outer margin 1018 of the upper side 1012, before reaching the outlets 1124.

When the reactor illustrated and described above is employed to practice the process provided by this invention for treating a silicon wafer having a front, device side, a back, non-device side, and an outer perimeter, so as to remove a thin film, such as a copper film, the silicon wafer is placed into the reactor with its back side being the lower side. An etchant capable of removing the copper is used as the processing. The etchant is delivered by a pump to the lower chamber and inert gas is used as the processing fluid entering the. The etchant is caused to flow over the back side, over an outer perimeter of the silicon wafer, and over an outer margin of the front side, but is prevented from flowing, over the front side except for the outer margin. After the etchant removes the thin film, any residual etchant is rinsed away, as with deionized water.

The processing fluid can be a mixture of an acid and an oxidizing agent.

If the thin film is a metal film, such as a copper film, a preferred etchant is a mixture of hydrofluoric acid and hydrogen peroxide, as an oxidizing agent, most preferably 0.5% hydrofluoric acid arid 10% hydrogen peroxide, by volume, with the remainder being deionized water. An alternative reagent is approximately 10% sulfuric acid, although other concentrations of sulfuric acid from approximately 5% to approximately 98%, along with approximately 0% to 20% of an oxidizing agent, can be instead used to remove a metal film, such as a copper film.

The processing fluid can also be a mixture of sulfuric acid and amonium persulfate.

Other alternative reagents that can be instead used to remove a metal film, such as a copper film, include mixtures of hydrofluoric acid and a surfactant, mixtures of hydrofluoric and hydrochloric acids, mixtures of nitric and hydrofluoric acids, and EKC 5000, which is a proprietary reagent available commercially from EKC of Hayward, Calif.

Figure 1D:
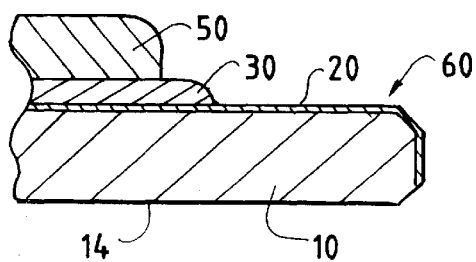
Figure 2D:
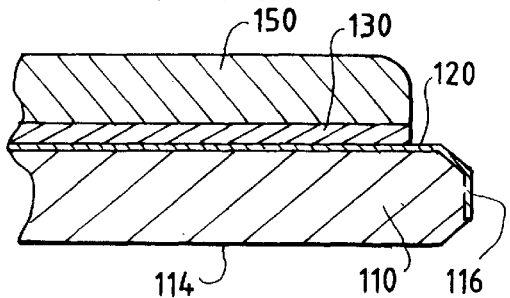

When the resultant structure 160 illustrated in FIG. 2D is compared to the resultant structure 60 illustrated in FIG. 1D, it is evident that the annular region 162 not available for fabricating such interconnect structures and/or metallized components from the resultant structure 160 is smaller than the annular region 62 that is not available for fabricating such interconnect structures and/or metallized components on the resultant structure 60, all other dimensions being alike. It follows that this invention enables a greater yield of microelectronic devices from a silicon wafer of a given size. Advantageously, the process provided by this invention not only removes a thin film, such as a copper film, but also removes any contaminant, such as any copper or other metal, that the reagent is capable of solvating from the back side of the silicon wafer.

The thin film removed by the process of the present invention could also be substantially comprised of silicon nitride, silicone oxide, polysilicon, or photoresist.

Various modifications can, of course, be made without departing from the scope and spirit of the invention. The invention, therefore, should not be restricted, except by the following claims and their equivalents.

What is claimed is:

1. A process for treating a microelectronic workpiece having a first side, a second side, and an outer perimeter joining the first and second sides at their periphery, the process comprising:

applying a barrier layer over the second side and over at least a portion of the outer perimeter of the microelectronic workpiece;

applying a seed layer exterior to the barrier layer;

applying a metallization layer on the seed layer;

selectively providing a processing fluid capable of etching at least the seed layer and metallization layer to flow over an outer margin of the second side while preventing the processing fluid from flowing over those portions of the second side interior to the outer margin, so as to substantially remove the seed layer and metallization layer from the outer margin of the second side.

2. A process as set forth in claim 1 wherein the step of applying a metallization layer is comprised of the step of electroplating at least a portion of the metallization layer on the seed layer.

3. A process at set forth in claim 2 wherein the metallization layer comprises copper.

4. A process as set forth in claim 1 wherein the step of selectively providing comprises the steps of:

applying the processing fluid and a further processing fluid respectively to the first and second sides of the microelectronic workpiece;

selectively providing contact between the processing fluid and the first side of the microelectronic workpiece, and an outer margin of the second side of the microelectronic workpiece while, concurrently, selectively providing contact between the farther processing fluid and the second side of the microelectronic workpiece to the substantial exclusion of the outer margin of the second side.

5. A process as set forth in claim 1 wherein the step of selectively providing comprises the steps of:

applying the processing fluid and a further processing fluid respectively to the first and second sides of the microelectronic workpiece;

inhibiting contact between the further processing fluid and the outer margin of the second side of the microelectronic workpiece while, concurrently, providing contact of the processing fluid with the first side of the microelectronic workpiece and outer margin of the second side of the microelectronic workpiece.

6. A process as set forth in claim 1 wherein the step of selectively providing comprises the steps of:

introducing the processing fluid at the first side of the microelectronic workpiece;

introducing a further processing fluid at the second side of the microelectronic workpiece;

driving the processing fluid to contact the first side of the microelectronic workpiece, the outer perimeter, and a peripheral margin of the second side of the microelectronic workpiece;

driving the further processing fluid to contact the second side of the microelectronic workpiece substantially only at those portions of the second side interior to the peripheral margin of the second side.

7. A process of set forth in claim 6 wherein the second side of the microelectronic workpiece is a device side thereof.

8. A process as set forth in claim 6 wherein the step of driving the first processing fluid comprises driving the first processing fluid using centripetal acceleration resulting, at least in part, from rotation of the microelectronic workpiece.

9. A process as set forth in claim 6 wherein the step of driving the second processing fluid comprises driving the second processing fluid using centripetal acceleration resulting at least in part, from rotation of the microelectronic workpiece.

10. A process as set forth in claim 6 wherein the step of driving the first processing fluid is further defined in that the first processing fluid is driven by a pump.

11. The process as set forth in claim 6 wherein the step of driving the second processing fluid is further defined in that the second processing fluid is driven by a pump.

12. A process for treating a microelectronic workpiece having a first side, a second side, an outer perimeter, and with a barrier layer on the second side and on at least a portion of the outer perimeter, and with a seed layer on the barrier layer, the process comprising:

applying a metallization layer on the seed layer;

flowing a processing fluid, capable of etching at least the seed layer and the metallization layer, over the first side and over an outer margin of the second side;

preventing the processing fluid from flowing over areas inside of the outer margin on the second side; and removing the seed layer and metallization layer from the first side and from the outer margin of the second side, by etching them away with the processing fluid.

13. The process of claim 12 wherein the metallization layer comprises copper.

14. The process of claim 13 wherein the flowing step comprises:

applying the processing fluid to the first side of the workpiece;

applying a second processing fluid to the second side of the workpiece;

contacting the processing fluid with the first side of the workpiece and an outer margin of the second side of the workpiece;

concurrently contacting the second processing fluid with the second side of the workpiece, except at the outer margin of the second side.

15. The process of claim 12 wherein the preventing step comprises spinning the workpiece to create centrifugal force acting on the processing fluid.

16. A process for treating a microelectronic workpiece having a first side, a second side, an outer perimeter, a barrier layer on the second side and on at least a portion of the outer perimeter, and with a seed layer on the barrier layer, the process comprising the steps of:

applying a metallization layer on the seed layer;

introducing a first processing fluid, capable of etching at least the seed layer and the metallization layer, to the first side of the workpiece;

introducing a second processing fluid to the second side of the workpiece;

spinning the workpiece to distribute the first processing fluid over the first side of the workpiece, the outer perimeter, and an outer annular area of the second side of the workpiece;

distributing the second processing fluid over the second side of the workpiece only on an inner area of the second side inside of the outer annular area; and removing the seed layer and metallization layer from the first side and from the outer annular area of the second side, by etching the layers away with the first processing fluid.

17. The process of claim 16 wherein the second side of the workpiece is a device side thereof.

* * * * *